United States Patent [19]
Duran

[11] Patent Number: 5,503,684
[45] Date of Patent: Apr. 2, 1996

[54] TERMINATION SYSTEM FOR SOLAR PANELS

[75] Inventor: Gilbert Duran, Chatsworth, Calif.

[73] Assignee: Silicon Energy Corporation, Chatsworth, Calif.

[21] Appl. No.: 366,961

[22] Filed: Dec. 30, 1994

[51] Int. Cl.$^6$ .................................. H01L 31/048
[52] U.S. Cl. .................. 136/251; 136/259; 439/700; 439/824
[58] Field of Search ................... 136/251, 259; 257/459; 439/700, 824

[56] References Cited

U.S. PATENT DOCUMENTS

| | | | |
|---|---|---|---|
| 2,224,343 | 12/1940 | Grimaldi | 439/17 |
| 3,747,327 | 7/1973 | Uchiyama | 368/204 |
| 3,780,519 | 12/1973 | Tokunaga | 368/205 |
| 4,097,308 | 6/1978 | Klein et al. | 136/251 |
| 4,131,123 | 12/1978 | Della-Vedowa et al. | 136/251 |
| 4,239,555 | 12/1980 | Scharlack et al. | 136/251 |
| 4,371,739 | 2/1983 | Lewis et al. | 136/251 |
| 4,457,578 | 7/1984 | Taylor | 439/801 |
| 4,776,896 | 10/1988 | Umemoto | 136/256 |
| 5,110,369 | 5/1992 | Tornstrom et al. | 136/251 |
| 5,268,038 | 12/1993 | Riermeier et al. | 136/251 |
| 5,281,148 | 1/1994 | Thompson | 439/59 |
| 5,290,366 | 3/1994 | Riermeier et al. | 136/244 |

*Primary Examiner*—Aaron Weisstuch
*Attorney, Agent, or Firm*—Daniel C. McKown

[57] ABSTRACT

A termination system for a solar panel of the type in which the photoactive material and a silver terminal pad are covered by a protective layer of an insulative material includes a hole through the protective layer exposing a portion of the silver pad and further includes a terminal body having a base that is bonded to the protective layer and having a bore extending through the terminal body and concentric with the hole in the protective layer, and further including a compression spring inserted into the bore in the terminal body and bearing against the silver pad and urged against the silver pad by a sphere that is moved toward the silver panel through the bore in the terminal body by advancing a set screw. The sphere ensures that as the set screw is turned no torque is imparted to the spring. The resulting termination is inexpensive and easy to make, and it provides a good solderless contact with the silver pad and is mechanically robust and hermetically sealed.

7 Claims, 2 Drawing Sheets

TERMINATION SYSTEM FOR SOLAR PANELS

BACKGROUND OF THE INVENTION

1. Field of the Invention

The present invention is in the field of solar panels, and more specifically relates to a structure that provides an electrical terminal for a solar panel.

2. The Prior Art

The conventional technique for electrically terminating a photovoltaic solar panel is to attach a wire ribbon made of tin-plated copper to a conductive film on the photovoltaic substrate surface. The attachments are made by a soldering technique. The problems that can occur with soldered joints are well known, and are aggravated by the exposure of the solar panels to outdoor conditions. U.S. Pat. No. 5,268,038 of Riermeier, et al. issued Dec. 7, 1993 shows a terminal in which a conductive ribbon is soldered to conductive strips within the panel. Also, FIG. 1, below, shows a typical prior art termination system.

Dissatisfaction with soldered connections was evident as early as Jul. 24, 1973 when U.S. Pat. No. 3,747,327 issued to Uchiyama. He showed that a compressed elastomeric member can exert a continuing force on conductive elements, thereby maintaining a solderless contact.

In U.S. Pat. No. 4,776,896 issued Oct. 11, 1988 to Umemoto, there is shown the use of a leaf spring to maintain contact between elements of a solar battery.

The desire for solderless contacts became a necessity with the advent of removable electric circuit cards. In U.S. Pat. No. 4,993,957 issued Feb. 19, 1991 to Shino, there is shown a contact employing a body of silicone rubber containing a silver powder that is urged against a conductor to provide a contact.

In U.S. Pat. No. 5,281,148 issued Jul. 25, 1994, Thompson shows a connector for electric circuit cards that uses a biased ball bearing contact.

Finally, in U.S. Pat. No. 2,224,343 issued Dec. 10, 1940, Grimaldi shows a swivel connection that employs springs and a conductive ball to eliminate twisting and kinking in appliance cords.

Thus, although the problem of designing a reliable solderless electrical terminal for a solar panel has been recognized, it remained for the present inventor to delineate a specific successful solution to the problem, particularly as it relates to the termination of solar panels.

SUMMARY OF THE INVENTION

It is an objective of the present invention to provide a structure for an electrical terminal on a solar panel wherein the terminal is mechanically robust, weather resistant and electrically reliable.

In a typical application, the terminal must make contact with a conductive pad that has been deposited on a photovoltaic layer that is sandwiched between a glass superstrate on one side, and a protective layer of an insulative material on the other side.

In accordance with the present invention, a hole is made through the protective layer directly above the conductive pad. Next, a terminal body is attached to the exposed surface of the protective layer. Typically, the terminal body is bonded to the exposed surface. Thereafter, a resilient contact is inserted through a bore in the terminal body and through the hole in the protective layer to bear against the conductive pad. Next, the resilient contact is compressed against the conductive pad, and finally the resilient contact is held in the compressed condition and the bore in the terminal body is sealed.

In a preferred embodiment, the resilient contact is a conductive compression spring, and it is compressed by advancing a set screw through the bore of the terminal body. A conductive sphere is included between the set screw and the conductive compression spring to prevent torque from being applied to the compression spring as the set screw is turned.

The novel features which are believed to be characteristic of the invention, both as to organization and method of operation, together with further objects and advantages thereof, will be better understood from the following description considered in connection with the accompanying drawings in which a preferred embodiment of the invention is illustrated by way of example. It is to be expressly understood, however, that the drawings are for the purpose of illustration and description only and are not intended as a definition of the limits of the invention.

DETAILED DESCRIPTION OF THE PREFERRED EMBODIMENT

Figure 1:
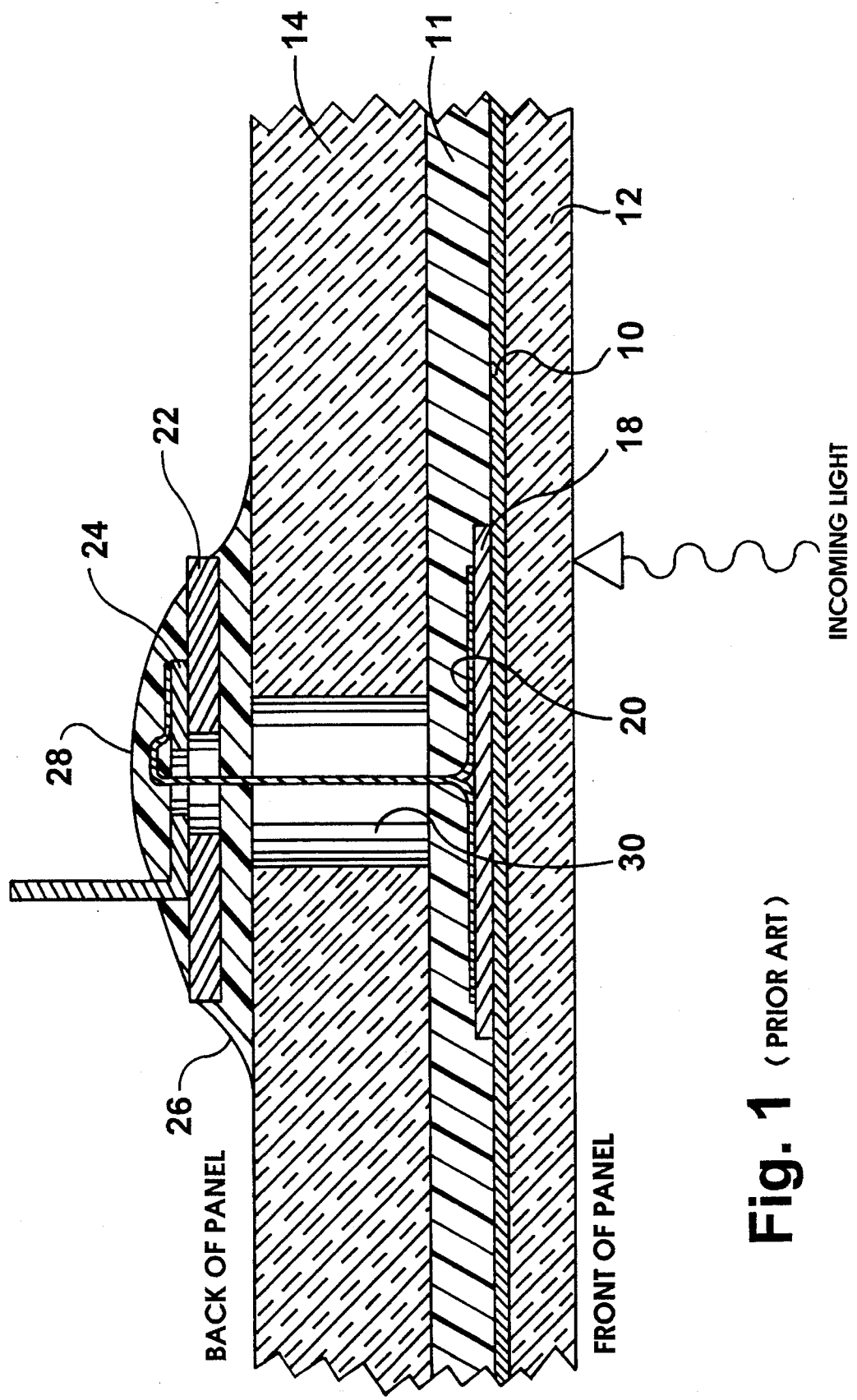
FIG. 1 is a side elevational view in cross section showing a termination system commonly used in the prior art; and, FIG. 2 is a side elevational view in cross section showing a termination system in accordance with a preferred embodiment of the present invention.

FIG. 1 shows a termination system of a type that is typical of the prior art. In FIG. 1, as well as in FIG. 2, the solar panel is shown in the position in which it is manufactured (since we are concerned with the manufacturing process). In use, the panel is typically turned upside down from the position shown in the drawings, so that the superstrate 12 becomes the front layer facing the sun, and so that the terminal 24 is on the back of the panel where it might have a degree of protection from the weather.

Initially, in the prior art termination system shown in FIG. 1, the photo-active material 10 along with conducting strips are deposited in the form of thin films on the glass superstrate 12. A somewhat thicker silver pad 18 is connected to the conductive strips with the intention that the silver pad will be a part of the terminal system. A protective back glass 14 is placed over the photo-active material 10 and a polymer 11 (specifically ethylene vinyl acetate) is used as an adhesive for joining the superstrate 12 and the back glass 14 and for sealing them around their edges. A copper ribbon 20 which has been soldered to the silver pad 18 is brought out through a slit in the polymer 11 and through a hole 30 in the back glass 14. Next, the copper ribbon 20 is brought up through the washer 22 and is soldered to the terminal body 24. A silicone potting compound 26 bonds the washer 22 to the back glass 14, and is also applied to seal the terminal at location 28.

In the prior art termination system of FIG. 1, the solder joints that connect the copper ribbon 20 to the silver pad 18 and to the terminal body 24 tend to be sources of reliability problems. Also, soldering requires special equipment, tends to be time-consuming when compared with other types of connection, and requires the use of hazardous materials for fluxing and cleaning. Therefore, the present inventor set out to find a better terminal for solar panels.

Figure 2:
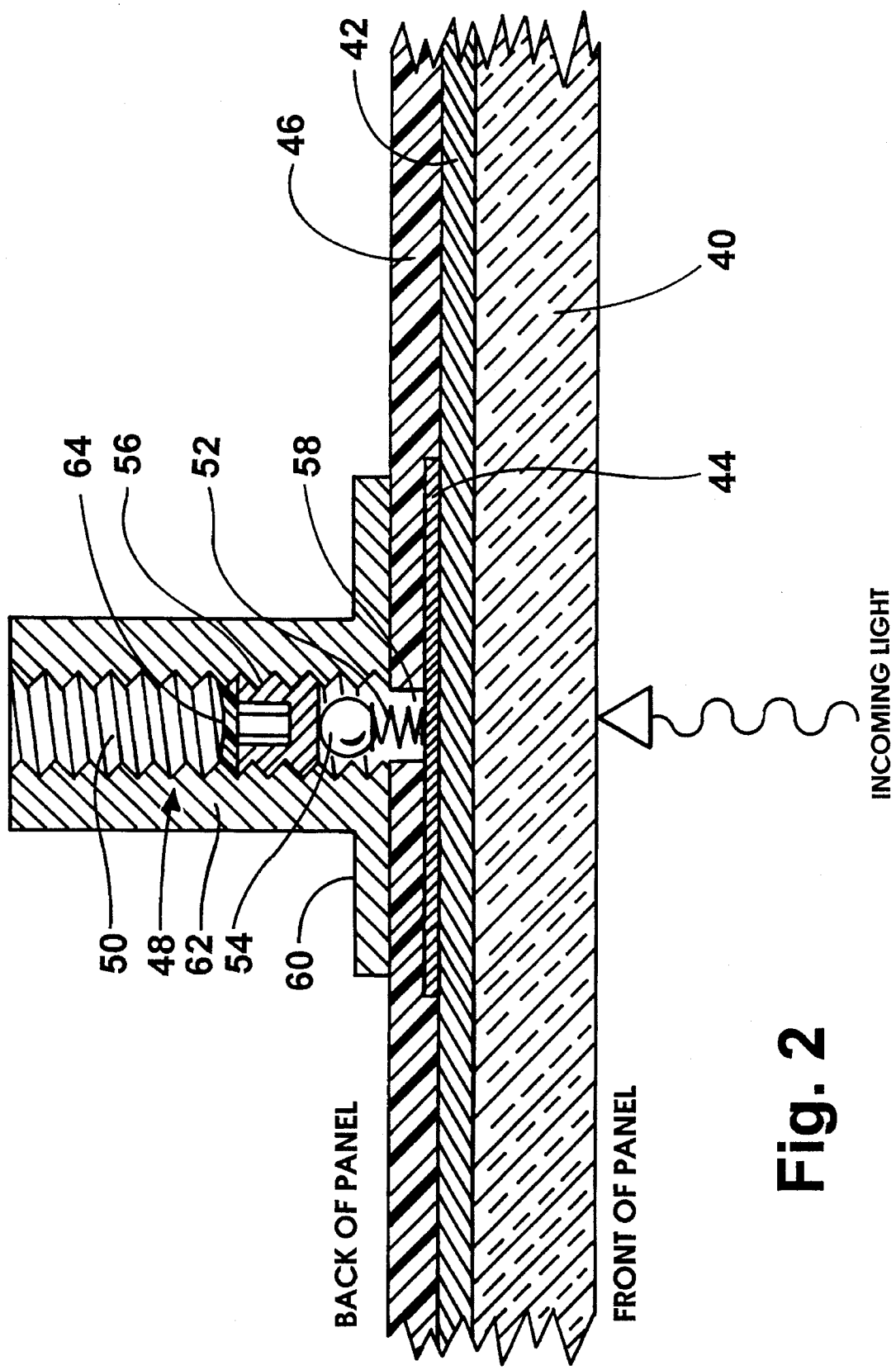

FIG. 2 shows a preferred embodiment of the present invention.

As is usual for this type of solar panel, a thin film of photo-active material 42 is deposited on a glass superstrate 40. The layer 42 includes a silver pad 44 that is intended for use in terminating the electrical conductors of the thin film layer 42. The layer 42 and the silver pad 44 are covered by a protective layer 46 of an insulative material, which is a silicone compound in the preferred embodiment. A hole 58 in the protective layer 46 is produced by a masking technique.

The terminal body 48 includes a base portion 60 from which a stand-off portion 62 extends away from the solar panel. The terminal body further includes a bore 50 that extends entirely through the terminal body in the preferred embodiment. The base 60 is bonded to the protective layer 46 with the bore 50 approximately concentric with the hole 58.

A spring 52 is inserted through the bore 50 and placed in contact with the silver pad 44. In the preferred embodiment the spring is composed of beryllium copper and is plated with silver. Next, a sphere 54 is inserted through the bore 50 so as to rest on the lower end of the spring 52. In the preferred embodiment, the sphere 54 is composed of brass and is nickel plated. Next, a set screw 56 is screwed into the bore 50, and the set screw urges the sphere 54 against the spring 52. As the spring 52 is compressed, elastic restoring forces in the spring cause the upper end of the spring to bear against the silver pad, thereby assuring that the spring makes good electrical contact with the silver pad. The purpose of the sphere 54 is to prevent the set screw from exerting any torque on the spring 52. This results because of the very small area of contact between the set screw 56 and the sphere 54. After the set screw 56 has been tightened, the bore 50 behind the set screw is sealed with a few drops of a silicone potting material 64. It can be appreciated that the bore 50 is of small diameter; for example, in the preferred embodiment, the bore is approximately 0.125 inch in diameter. Because of its small diameter and the presence of the set screw 56 in it, the bore 50 is easily sealed, and the entire termination is hermetically sealed by the silicone potting material 64. The comparatively large diameter of the base 60 permits the terminal body to remain securely attached to the protective layer 46 in spite of the shocks and forces to which the terminal is subjected during transportation, installation, and operation.

Thus, there has been described a terminal system for a solar panel that is easy to construct and install, that is easily sealed against moisture and that is quite robust in resisting applied forces.

The foregoing detailed description is illustrative of one embodiment of the invention, and it is to be understood that additional embodiments thereof will be obvious to those skilled in the art. The embodiments described herein together with those additional embodiments are considered to be within the scope of the invention.

What is claimed is:

1. A solar panel including a plate-like superstrate having a lower surface and an upper, light incident surface, including a thin film photoactive layer having a lower surface and deposited on the lower surface of the superstrate, the thin film layer including a conductive pad on the lower surface thereof, the solar panel further including a protective layer of an insulative material covering the lower surface of the thin film layer and the conductive pad, and an improved termination system comprising:

a hole extending through the protective layer located above the conductive pad;

a terminal body attached to the lower surface of the protective layer;

resilient contact means extending through said hole in the protective layer and compressed between said terminal body and the conductive pad, for maintaining electrical contact between said terminal body and the conductive pad.

2. The solar panel of claim 1 wherein said resilient contact means includes an electrically conductive compression spring.

3. The solar panel of claim 1 wherein said terminal body is bonded to the protective layer.

4. The solar panel of claim 1 wherein said protective layer is composed of a silicone.

5. A solar panel including a plate-like superstrate having a lower surface and an upper, light incident surface, including a thin film photoactive layer having a lower surface and deposited on the lower surface of the superstrate, the thin film layer including a conductive pad on the lower surface thereof, the solar panel further including a protective layer of an insulative material covering the lower surface of the thin film layer and the conductive pad, and an improved termination system comprising:

a hole extending through the protective layer located directly above the conductive pad;

a terminal body including a threaded bore, attached to the lower surface of the protective layer and positioned with the threaded bore overlying said hole in the protective layer and overlying the conductive pad;

a compression spring coaxial with the threaded bore, having a lower end and having an upper end in electrical contact with the conductive pad and extending upwardly through said hole in the protective layer into the threaded bore;

a set screw located within the threaded bore and having an upper end;

a conductive sphere located within the threaded bore between the upper end of said set screw and the lower end of said compression spring, said conductive sphere urged upward against said compression spring;

whereby the upper end of said compression spring is urged against the conductive pad so as to make good electrical contact with the conductive pad, and whereby said conductive sphere prevents rotation of said set screw from being transmitted to said compression spring.

6. The solar panel of claim 5 wherein said terminal body is bonded to the protective layer.

7. The solar panel of claim 5 wherein the protective layer is composed of a silicone.

* * * * *